(12) United States Patent
Granik

(10) Patent No.: US 9,355,201 B2
(45) Date of Patent: May 31, 2016

(54) DENSITY-BASED INTEGRATED CIRCUIT DESIGN ADJUSTMENT

(71) Applicant: Mentor Graphics Corporation, Wilsonville, OR (US)

(72) Inventor: Yuri Granik, Palo Alto, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/970,281

(22) Filed: Aug. 19, 2013

(65) Prior Publication Data

US 2014/0053123 A1 Feb. 20, 2014

Related U.S. Application Data

(60) Provisional application No. 61/684,700, filed on Aug. 17, 2012.

(51) Int. Cl.
*G06F 17/50* (2006.01)

(52) U.S. Cl.
CPC .................. *G06F 17/5072* (2013.01)

(58) Field of Classification Search
CPC .................................. G06F 17/5072
USPC ........................................ 716/122
See application file for complete search history.

(56) References Cited

U.S. PATENT DOCUMENTS

| | | |
|---|---|---|
| 6,643,616 B1 | 11/2003 | Granik et al. |
| 7,966,595 B1 * | 6/2011 | Chong et al. ............ 716/118 |
| 2002/0133801 A1 | 9/2002 | Granik et al. |
| 2004/0005089 A1 | 1/2004 | Torres Robles et al. |
| 2004/0133871 A1 | 7/2004 | Granik et al. |
| 2005/0044513 A1 | 2/2005 | Torres Robles et al. |
| 2005/0168498 A1 | 8/2005 | Granik |
| 2005/0216878 A1 | 9/2005 | Word et al. |
| 2005/0278685 A1 | 12/2005 | Granik et al. |
| 2006/0200790 A1 | 9/2006 | Shang et al. |
| 2006/0269875 A1 | 11/2006 | Granik |
| 2007/0124708 A1 | 5/2007 | Torres Robles et al. |
| 2007/0196747 A1 | 8/2007 | Granik et al. |
| 2007/0198963 A1 | 8/2007 | Granik et al. |
| 2008/0174756 A1 | 7/2008 | Granik |
| 2009/0100389 A1 | 4/2009 | Kusnadi et al. |
| 2009/0125869 A1 | 5/2009 | Granik et al. |
| 2009/0271759 A1 | 10/2009 | Torres Robles et al. |
| 2010/0023915 A1 | 1/2010 | Granik |
| 2010/0039633 A1 | 2/2010 | Granik |
| 2010/0269084 A1 | 10/2010 | Granik |
| 2010/0269086 A1 | 10/2010 | Granik |
| 2011/0004856 A1 | 1/2011 | Granik et al. |
| 2011/0047519 A1 | 2/2011 | Torres Robles et al. |
| 2011/0138343 A1 | 6/2011 | Granik |
| 2011/0202893 A1 | 8/2011 | Kusnadi et al. |
| 2011/0202898 A1 | 8/2011 | Kusnadi et al. |
| 2011/0204470 A1 * | 8/2011 | Cheng et al. ............ 257/499 |
| 2011/0239177 A1 * | 9/2011 | Chong et al. ............ 716/119 |

(Continued)

*Primary Examiner* — Suresh Memula
(74) *Attorney, Agent, or Firm* — Klarquist Sparkman, LLP

(57) ABSTRACT

The disclosed technology is related to adjusting an integrated circuit design while accounting for a local density of the design. In particular exemplary embodiments, a local density value for a layout design that defines a plurality of geometric shapes is derived. Subsequently, one or more of the geometric shapes are adjusted such that the local density value is preserved. With some implementations, the local density value is preserved if the adjusted local density value is within a threshold amount of the derived local density value.

15 Claims, 13 Drawing Sheets

(56) References Cited

U.S. PATENT DOCUMENTS

| | | |
|---|---|---|
| 2012/0042291 A1 | 2/2012 | Granik et al. |
| 2013/0036390 A1 | 2/2013 | Torres Robles et al. |
| 2013/0086535 A1* | 4/2013 | Rieger et al. ............ 716/51 |
| 2013/0191795 A1 | 7/2013 | Lippincott et al. |
| 2013/0227500 A1 | 8/2013 | Sakajiri et al. |
| 2013/0328155 A1* | 12/2013 | Konomi ............ 257/499 |
| 2014/0053123 A1 | 2/2014 | Granik |
| 2014/0229903 A1 | 8/2014 | Granik et al. |
| 2015/0067628 A1 | 3/2015 | Torres Robles et al. |

\* cited by examiner

DENSITY-BASED INTEGRATED CIRCUIT DESIGN ADJUSTMENT

CROSS REFERENCE TO RELATED APPLICATIONS

This application claims the benefit of U.S. Provisional Application No. 61/684,700 filed on Aug. 17, 2012, and entitled "DENSITY-BASED INTEGRATED CIRCUIT DESIGN ADJUSTMENT", which is hereby incorporated herein by reference.

FIELD

The disclosed technology is directed towards the field of integrated circuit design. More specifically, this application is directed towards adjusting an integrated circuit design while accounting for a local density of the design.

BACKGROUND

Electronic devices, such as integrated circuits, are used in a variety of products, from automobiles to microwaves to personal computers. Designing and fabricating integrated circuit devices typically involves many steps, known as a "design flow." The particular steps of a design flow often are dependent upon the type of integrated circuit being designed, its complexity, the design team, and the integrated circuit fabricator or foundry that will manufacture the integrated circuit.

Several steps are common to most design flows. Initially, the specification for the new integrated circuit is transformed into a logical design. With this logical design, the circuit is described in terms of both the exchange of signals between hardware registers and the logical operations that are performed on those signals. The logical design normally employs a Hardware Design Language (HDL), such as the Very high speed integrated circuit Hardware Design Language (VHDL). The logical design is then analyzed, to confirm that the logic incorporated into the design will accurately perform the functions desired for the circuit. This analysis is referred to as verification.

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The device design typically corresponds to the level of representation displayed in conventional circuit diagrams. Verification is generally performed at this stage as well.

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, gates, etc.) that make up the circuit design. While the geometric elements are typically polygons, other shapes, such as circular and elliptical shapes, also may be employed. These geometric elements may be custom designed, selected from a library of previously-created designs, or some combination of both. Geometric elements also are added to form the connection lines that will interconnect these circuit devices. Layout tools, such as Mentor Graphics' IC Station or Cadence's Virtuoso, are commonly used for both of these tasks.

After the layout design is finalized, the integrated circuit device can be manufactured from silicon wafers using a lithographic process. During lithographic processes, the geometric shapes mentioned above are formed on a base material (e.g. silicon). Those of ordinary skill in the art will appreciate that lithographic processes have certain limitations. That is, a particular lithographic process will typically be able to manufacture certain shapes having specific characteristics. For example, the minimum size of shapes may be limited, the minimum proximity of shapes to each pother may be limited, or other such characteristics.

As such, adjustments to the layout design are often made during the design process in order for the shapes represented in the layout design to conform to the required characteristics for the particular lithographic process in which the layout design is to be manufactured.

SUMMARY

Aspects of the disclosed technology are directed toward adjusting a layout design for an integrated circuit while preserving the local density of the layout design.

In various implementations, a local density value for a layout design that defines a plurality of geometric shapes is derived. Subsequently, one or more of the geometric shapes are adjusted such that the local density value is preserved. With some implementations, the local density value is preserved if the adjusted local density value is within a threshold amount of the derived local density value.

In some implementations, the local density may correspond to the area of a geometric shape. In some implementations, the local density may correspond to the combined area of a set of geometric shapes. In some implementations, the local density may correspond to a ratio of the area of a geometric shape to the area of a portion of the layout design. In some implementations, the local density may correspond to a ratio of the combined area of a set of geometric shapes to the area of a portion of the layout design.

These and additional implementations of invention will be further understood from the following detailed disclosure of illustrative embodiments.

BRIEF DESCRIPTION OF THE DRAWINGS

The disclosed technology will be described by way of illustrative implementations shown in the accompanying drawings in which like references denote similar elements, and in which.

DETAILED DESCRIPTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms such as "generate" to describe the disclosed implementations. These terms are often high-level abstractions of the actual operations that are performed. The actual operations that correspond to these terms may vary depending on the particular implementation.

I. Illustrative Operating Environment

Figure 1:
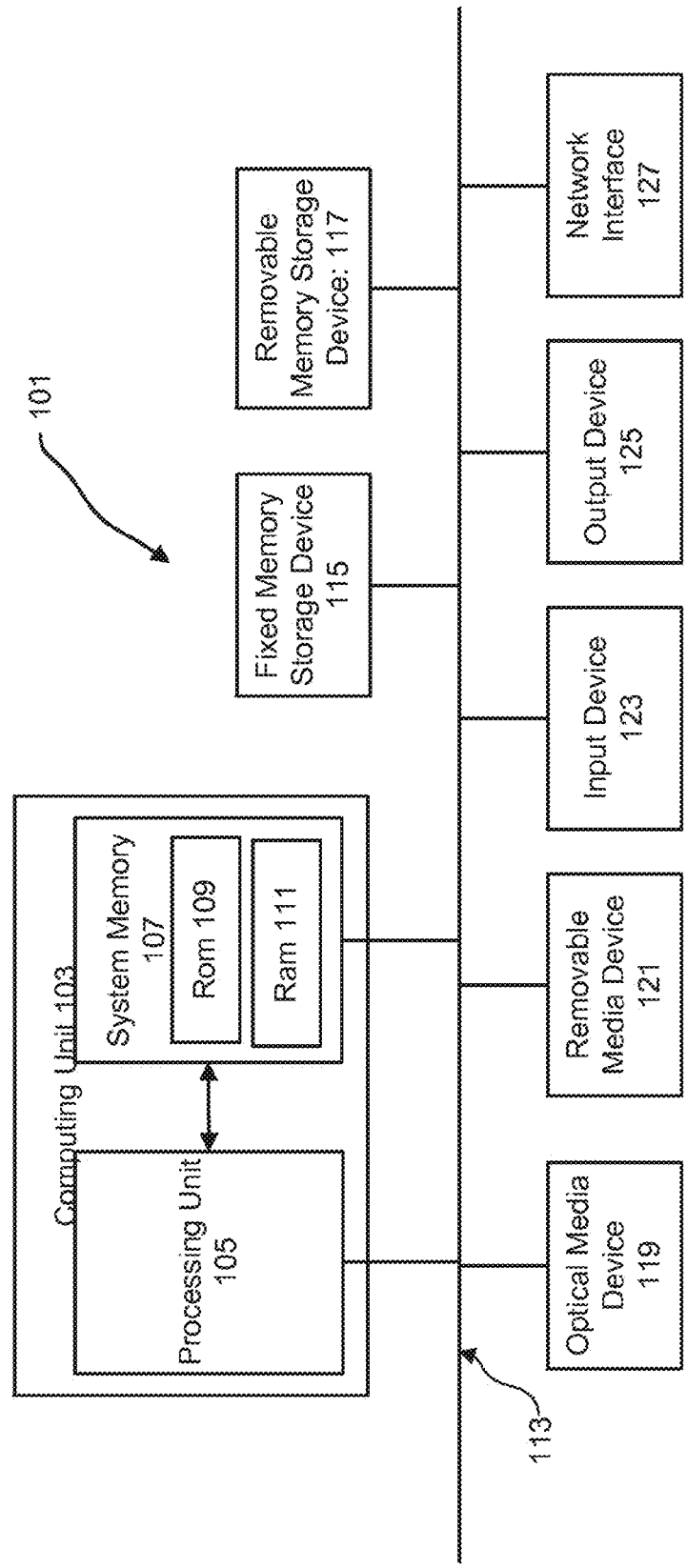
FIG. 1 illustrates a computing device platform.

As the techniques of the disclosed technology may be implemented using a programmable computer system executing software instructions, the components and operation of a computer system on which various implementations of the disclosed technology may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include a read-only memory ("ROM") 109 and/or a random access memory ("RAM") 111. As will be appreciated by those of ordinary skill in the art, either or both of the ROM 109 or the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

As stated above, various embodiments of the invention may be implemented using a programmable computer system executing software instructions, a computer readable medium having computer-executable software instructions stored thereon, or some combination thereof. Particularly, these software instructions may be stored on one or more computer readable media or devices, such as, for example, the system memory 107, or an optical disk for use in the optical media device 119. As those of ordinary skill in the art will appreciate, software instructions stored in the manner described herein are inherently non-transitory in nature. More specifically, the software instructions are available for execution by the computer system 101, as opposed to being transmitted to the computer system via a carrier wave or some other transitory signal.

II. Example Embodiments

A. Mask Rule Constraints

During the mask formation process, various mask writing tool manufacturers and foundries may have constraints on the sizes of features for geometrical elements that can be manufactured in a mask. For example, a mask writing tool manufacturer may specify a minimum line width that can be written by its mask writing tool, or that can be inspected after writing.

During layout correction processes, such as optical correction processes, geometric elements in a layout design may be modified. For example, the Calibre® pxOPC product available from Mentor Graphics® Corporation of Wilsonville, Oreg., adds secondary geometric elements to a layout design. As will be appreciated by those of ordinary skill in the art, while these added secondary geometric elements serve to improve the printability of the geometric elements onto a substrate during a lithographic process using a lithographic mask made from the layout design, the added secondary geometric elements are not themselves printed during the lithographic process.

When these secondary geometric elements are added to the layout design, their outlines may be irregular, with rounded edges and narrow widths. Because of these irregular outlines, the secondary geometric elements may not be writable into a mask by a conventional mask writing tool. In order to be written to a task, these raw secondary geometric elements typically must be converted into regular shapes that can be written by the mask writer, such as polygons. This conversion may be performed using any desired technique, such as, for example, a Manhattanization process.

During the conversion (e.g., Manhattanization) process, the secondary geometric elements are converted into regular shapes that still will not print during the lithographic process. During this conversion process (and the subsequent "fine tuning" process for improved lithographic printing quality), however, portions of the secondary geometric elements may be converted into shapes that violate one or more mask constraint rules. Accordingly, the final converted secondary geometric elements (and, with some implementations of the invention, the intermediate forms of the secondary geometric elements) must be further modified to ensure that they confirm with the mask rule constraints. Alternately, the conversion process must ensure that the secondary geometric elements comply with the mask rule constraints.

With various embodiments of the disclosed technology, geometric elements, such as the secondary geometric elements described above, are modified so that the lithographic impact of the geometric elements are not significantly changed. More particularly, various implementations of the disclosed technology modify the shape of geometric elements while maintaining the same local density across the geometric elements.

B. Illustrative Layout Design and Adjustment

Figure 2:
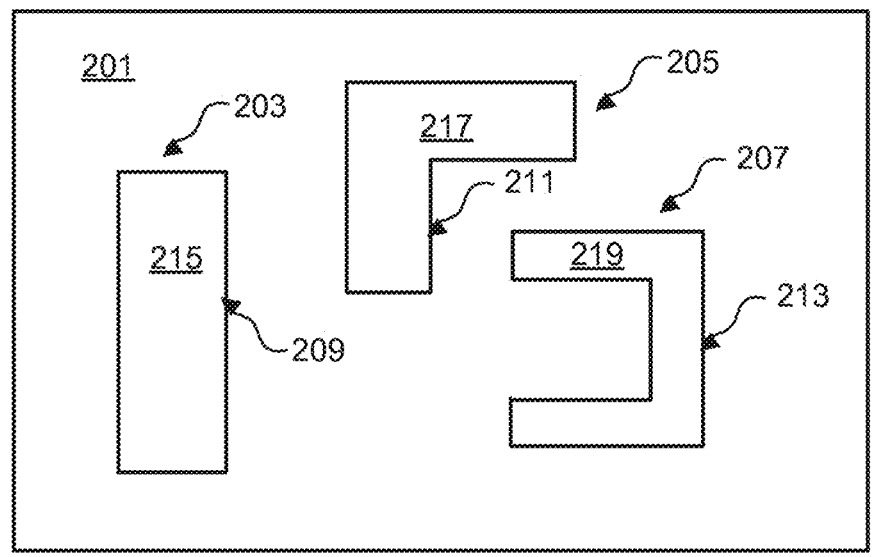
FIG. 2 illustrates an example layout design defining some geometric shapes.

As indicated above, various implementations of the disclosed technology provide for adjusting a layout design for an integrated circuit while preserving a local density value. In order to describe various illustrative implementations, an example layout design and adjustments are detailed first. FIG. 2 shows an example layout design 201 having shapes 203, 205 and 207 represented therein. Those of ordinary skill in the art will appreciate that typical integrated circuit design layouts will include many more shapes than are represented in this figure. However, only a few shapes are shown here for clarity of presentation. The present disclosure can be applied to layout designs more complicated than that shown here without departing from the spirit and scope of the claimed subject matter. Furthermore, although the disclosure and various implementations detailed herein are described with reference to the layout 201 of FIG. 2, various implementations can be applied to other layouts not detailed herein. Additionally, although reference is made herein to adjustments to shapes within a layout design, adjustments could also be made to shapes within a mask design, or shapes within other designs that are to be used to manufacture an integrated circuit. As can be seen from this figure, the shapes 203, 205 and 207 have boundaries 209, 211 and 213. Additionally, area 215, 217 and 219 for the shapes 203, 205 and 207 respectively is shown.

Figure 3:
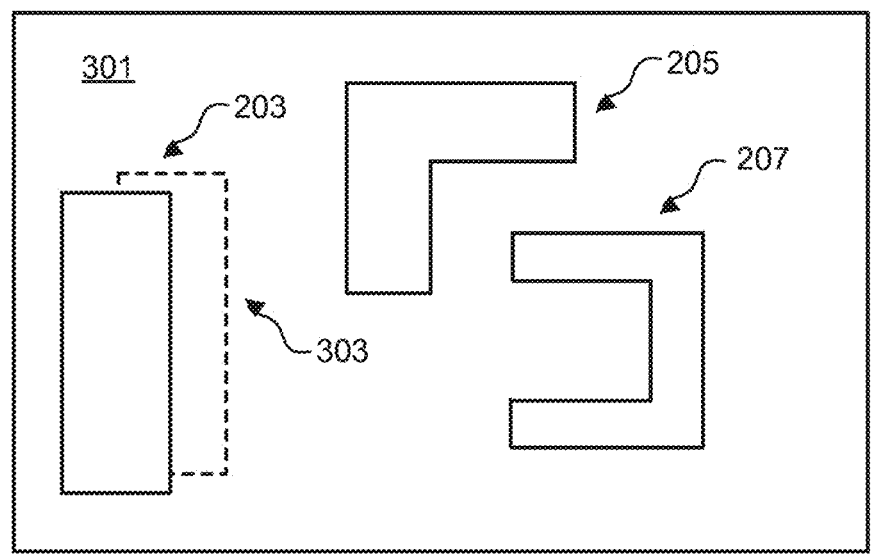
FIG. 3 shows the example layout design of FIG. 2 with an adjustment made to the positioning of one of the geometric shapes.

In some implementations, the positioning of a shape (e.g., the shape 203) is adjusted within the layout design 201. For example, FIG. 3 shows a layout 301, including the shapes 203, 205 and 207 from the layout 201. As can be seen from this figure, the shapes 205 and 207 have a position within the layout 301 similar to that within the layout 201. However, the shape 203 has an adjusted position within the layout 301 as shown by the outline of the original position 303.

Figure 4:
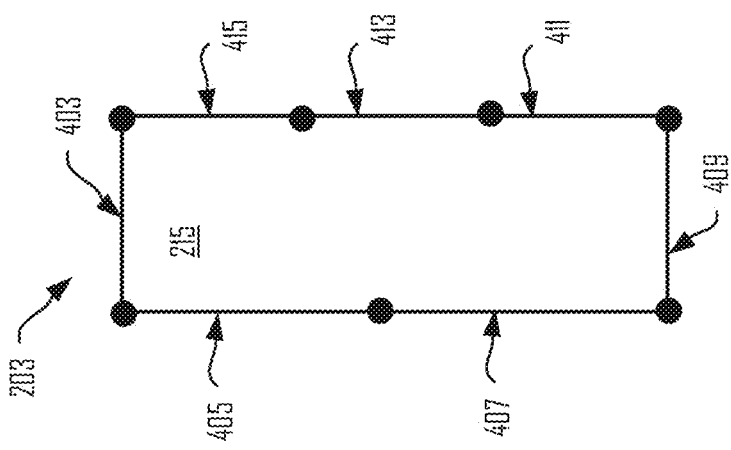
FIG. 4 shows one of the geometric shapes of FIG. 2.

With some implementations, the boundary of a shape (e.g., the boundary 209 of the shape 203) is adjusted within the layout design 201. FIG. 4 shows the shape 203, the boundary 209 and area 215. This figure further shows edge fragments 403-415. As can be seen from these figures, the edge fragments 403-415 correspond to the boundary 209. Those of ordinary skill in the art will appreciate, various methods for determining edge fragment size and other characteristics are known in the art. Furthermore, in typical layout adjustment processes, many more edge fragments will be generated to correspond to the boundary of a shape than are represented in FIG. 4. However, less than a typical number of edge fragments are shown in this figure for clarity of presentation and it is to be appreciated that the disclosure here can be applied to any number of edge fragments without departing from the spirit and scope of the claimed subject matter.

Figure 5:
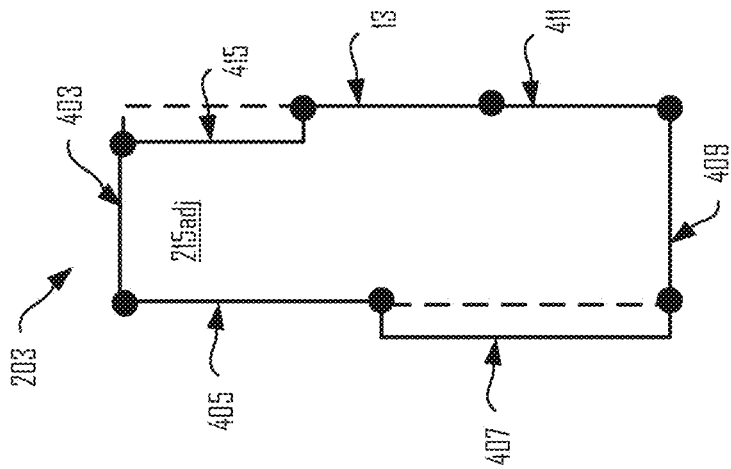
FIG. 5 shows the geometric shape shown in FIG. 4 with an adjustment made to the boundary of the shape.

In some implementations, the boundary 209 may be adjusted by adjusting the position of one or more of the edge fragments 403-415. FIG. 5 shows the shape 203 and edge fragments 403-415. However, as can be seen from this figure, the position of the edge fragments 407 and 415 has been adjusted relative to the position shown in FIG. 4. As those of ordinary skill in the art will appreciate, as the position of the edge fragments 407 and 415 has been adjusted, the area of the shape 203 after the adjustments may not correspond to the area 215. As such, an adjusted area 215adj is shown in FIG. 5.

Figure 6:
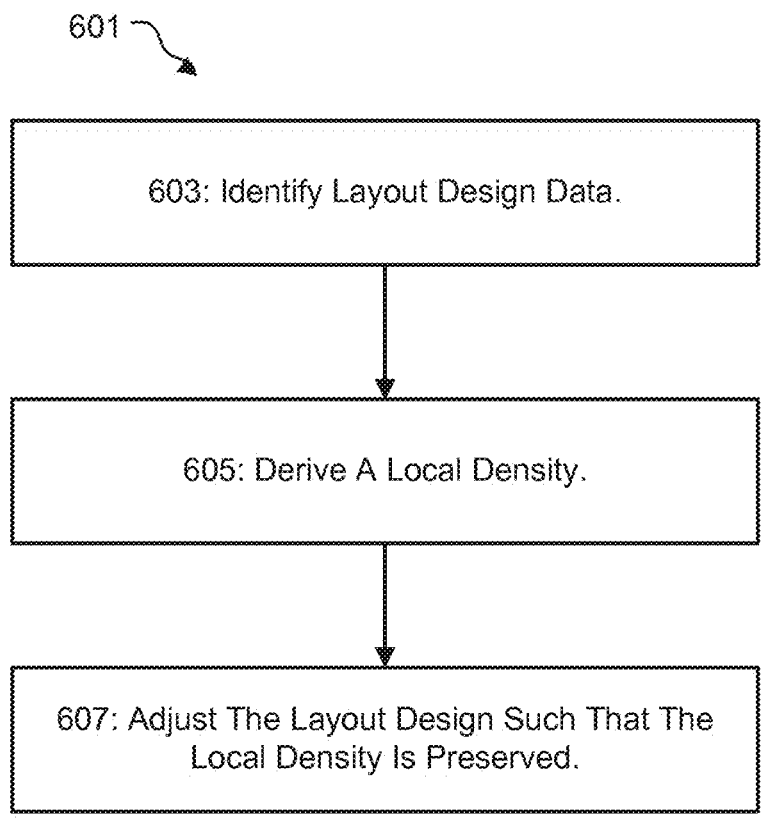
FIG. 6 shows a method of adjusting a layout design for an integrated circuit, arranged in accordance with various implementations of the invention.

FIG. 6 shows a method 601 for adjusting a layout design for an integrated circuit, arranged in accordance with various implementations of the invention. The method 601 will be described with reference to FIGS. 2-5, but it is to be appreciated that the method 601 may be applied to other layout designs not represented here without departing from the spirit and scope of the claimed subject matter. As can be seen from this figure, the method 601 identifies layout design data defining a plurality of shapes at operation 603. For example, data describing the layout 201 and shapes 203, 205 and 207 may be identified at operation 603. A local density for the layout design 201 is then derived at operation 605. Subsequently, the shapes (e.g., 203, 205 or 207) are adjusted at operation 607 such that the local density is preserved.

In some implementations, the local density may be described using the "mass" of the geometric shapes 203, 205 and 207. For example, in some implementations, the local density may be given by the following equations.

$$M = \int \int_A q(X, Y) dX\, dY \quad (1)$$

$$LD(X, Y) = q(X, Y) \quad (2)$$
$$= \frac{dM}{dA}$$
$$\approx \frac{\Delta M}{\Delta A}$$

Where X, Y correspond to coordinates within the layout design plane, q(X,Y) represents the characteristic function of the layout design, and A represents the area over which the local density is to be derived. As can be seen, the local density (LD) is the same as the characteristic function of the layout design, which is the ratio of area of polygons within a portion of the layout design to the total area of the layout design in that portion. As will be appreciated, the local density value for one portion of a layout design can be different than for another portion of the layout design.

Figure 7:
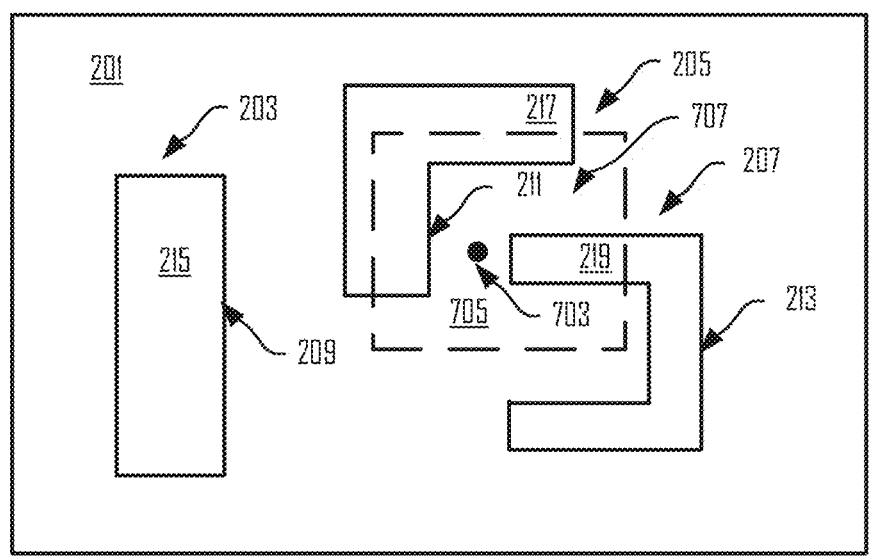
FIG. 7 shows the example layout design of FIG. 2 in additional detail.

As indicated, with various implementations, local density values will be derived for portions of a layout design. In some implementations, the layout design may be partitioned into equal portions. In other implementations partitions may be formed around selected portions of a layout design. For example, FIG. 7 shows the layout design of FIG. 2, having a point 703 identified and a partition 705 formed around the point 703. As detailed above, a local density 707 value could be determined for the partition 705.

With some implementations, the local density value for the partition 705 may be derived at operation 605 using the equations presented above. Subsequently, adjustments to the shapes 205 and/or 207 can be made at operation 607 while preserving the derived local density value. More specifically, the adjustments are made such that the local density value after the adjustments are made is within a threshold value of the derived local density value. In some implementations, the threshold value is zero, that is, the local density value is held constant. In other implementations the threshold value is 2%, that is, the local density is allowed to deviate up to 2% from the derived local density value. In still other implementations, a range of values are used for the threshold value, such as for example, 0-10%.

As indicated above, the partition 703 can be generated from different shapes (e.g. square, rectangle, circle, polygon, or the like) and can have different sizes. The size of the partition may be determined based upon the design flow in which the adjustments at operation 607 are performed. For example, the design flow could be an optical process correction flow, in which, potential manufacturing errors are detected in the design and the design adjusted (e.g. at operation 607) to account for or correct the errors. As such, the size it may be advantageous to size the partition 705 such that only a few errors are present in each partition. It may be advantageous to size the partition 705 such that only a single error is present in each partition.

As indicated above, in various implementations, the positioning of the shapes 203, 205, and/or 207 are adjusted at operation 607 such that the local density value is preserved. For example, referring back to FIG. 7 and the partition 705, the positioning of the shapes 205 and 207 within the layout design 201 could be adjusted such that the derived local density for the partition 705 remains within a threshold value of the adjusted local density. Alternatively or additionally, the edges of the shapes 205 and 207 could be adjusted such that the local density within the partition 705 remains the same. For example, in some implementations, the boundaries of the shapes 203, 205 and/or 207 are adjusted at operation 607 such that the local density value is preserved. For example, as detailed above in conjunction with FIGS. 4 and 5, the boundary of the shape 203 may be adjusted by adjusting edge fragments, such as, the edge fragments 407 and 415 for the edge fragments 405 and 415 may be adjusted.

III. Appendix

Various additional details relating to the disclosed technology, any one or more of which can be used together with the any of the embodiments described above, are discussed in this Appendix.

A. Notation

In this appendix, the following terms are used:
t—(fake) time
x—local coordinate, length along mask perimeter
y—local coordinate, normal to mask contour
$\Delta x$—size of the discretization pixel in x direction
$\Delta y$—size of the discretization pixel in y direction
X,Y—global Decart coordinates in the mask plane
$\rho(t,x)$—mask density
$\rho_j^t$—mask density in the j-pixel at the time t.
$p(t,x)$—pressure
$u(t,x)$—space violations
$v(t,x)$—width violations
$u_{min}$—minimum external distance (minimum spacing)
$v_{min}$—minimum internal distance (minimum width)
$a(x)$—diffusion coefficient
$b(x)$—mass production coefficient
$\alpha$—space/width balance in violations to pressure transfer
$W_u$—functional operator that transforms space violations into pressure
$W_v$—functional operator that transforms width violations into pressure
$q(X,Y)$—mask characteristic function B. Mask Density Mask "mass", in this section and for exemplary embodiments of the disclosed technology, can be represented as the "weight" of the mask polygons:

$$M = \int\int_A q(X, Y) dX\, dY \tag{3}$$

For certain embodiments, the area density $\rho$ of the mask is:

$$\rho(X, Y) = q(X, Y) \tag{4}$$
$$= \frac{dM}{dA}$$
$$\approx \frac{\Delta M}{\Delta A}$$

Figure 8:
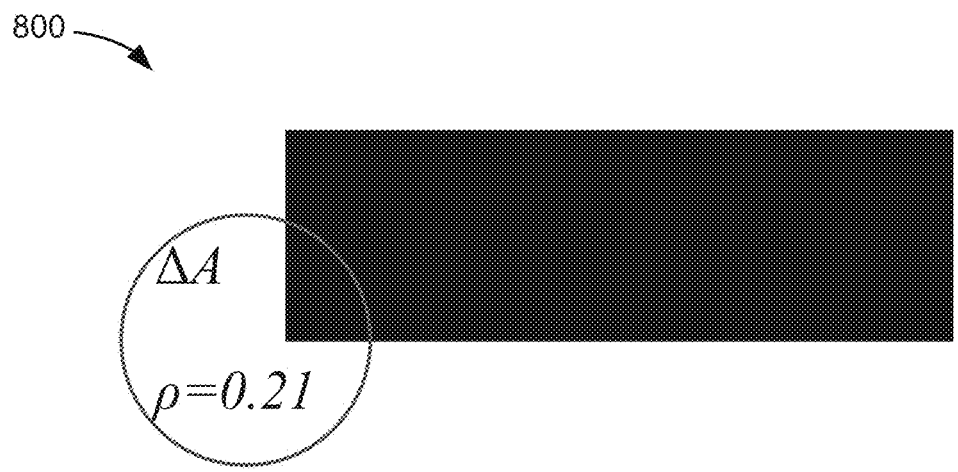
FIG. 8 shows an example mask polygon.

Diagram 800 in FIG. 8 shows an example of computing mask density. In FIG. 8 the mask density in the red circle is about 0.21.

The infinitesimal $\rho$ is the same as the mask characteristic function q, and is a dimensionless quantity, ratio of the area that is covered by mask polygons to the whole area. In the process of redistribution of mask transmission, $\rho$ can become different from q. It can be assumed that q can be inferred by thresholding $$q(x, y) = \begin{cases} 0, \rho < 0.5 \\ 0.5, \rho = 0.5 \\ 1, \rho > 0.5 \end{cases} \tag{5}$$

or by other means.

C. Example Embodiments

In certain embodiments, the method comprises moving polygon edges while preserving, when possible, the local density of the mask. In this section, the ala-Egorov MRC algorithm is formalized using mass transfer PDEs, these equations are discretized, and example solution methodologies are described.

1. Mask Polygon Cycles

Figure 9:
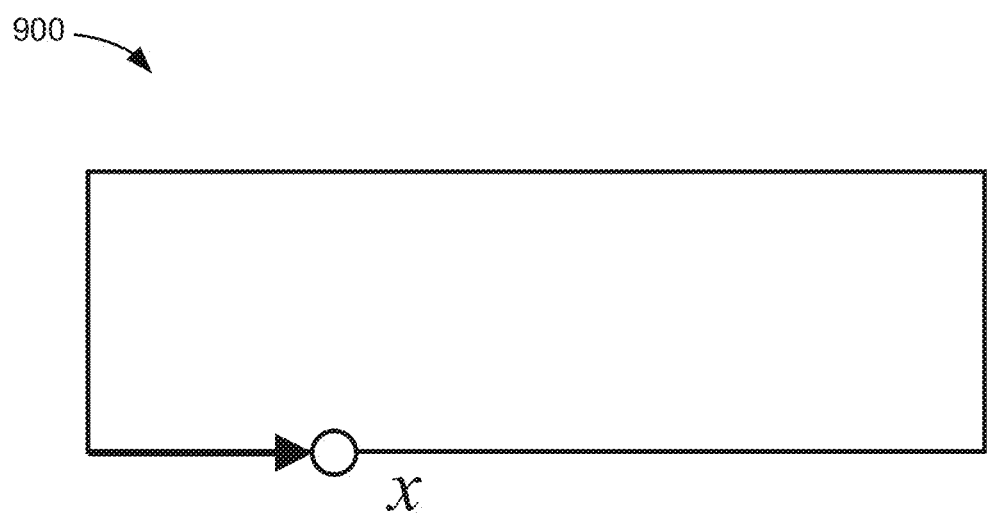
FIG. 9 shows a rectangle that represents a mask polygon.

A mask polygon can be represented using a mask polygon cycle. For example, the x-coordinate can run along the boundary of the mask polygon cycles, or one can say it is length of the boundary. In a tile, and for purposes of this disclosure, there are $C_n$ such cycles, numbered from 0 to $C_n-1$. For simplicity of notation, this section usually describes operations on only one such cycle, cycle 0. FIG. 9 is a diagram 900 that shows an example mask polygon cycle. In FIG. 9 the rectangle represents mask polygon cycle, and $0 \leq x \leq$ perimeter.

2. MRC Violations

MRC violations can be represented by functions u and v of x, and may change in time, so that $$u=u(t,x)$$

$$v=v(t,x). \quad (6)$$

Here u(t,x) is space (external) violation, and v(t,x) is width (internal) violation. Violations are non-negative quantities:

$$u \geq 0$$

$$v \geq 0, \quad (7)$$

which is desirably driven to 0 (meaning no violations) to resolve all violations. Violations are measured in units of length.

3. Conservation of Mask Transmission

In this subsection, the mask density in the vicinity of the mask boundary is considered. In this case, the lateral transfer of ρ(x) obeys the conservation law (continuity equation)

$$\frac{\partial \rho}{\partial t} = -\frac{\partial j}{\partial x} + \dot{p}, \quad (8)$$

where j=j(t,x) is the lateral mass flux, $\dot{\rho}=\dot{\rho}(t,x)$ is the mass production. For purposes of this analysis, inertial terms are not considered and thermodynamic relationships are used. Here, fluxes are proportional to the generalized forces, so that $$j = -a\frac{\partial p}{\partial x}, \quad (9)$$

where a=a(x) is a diffusion coefficient, p is pressure. For an isothermal process, the state equation is ρ~p, so traditional diffusion equations can be obtained from (3) and (4).

4. Forces

The next step is to link pressure p to MRC violations u and v. In the most general form:

$$p=f(u,v), \quad (10)$$

but, in certain embodiments, only a linear dependence is considered:

$$p(t,x)=\alpha u(t,x)-(1-\alpha)v(t,x)$$

$$0 \leq \alpha \leq 1, \quad (11)$$

unless MRC testing reveals that something more sophisticated is needed, like perhaps a hyperbolic tangent:

$$p=\tan h(u-v), \quad (12)$$

which can be used to saturate pressure when violations become very large. When coefficient α=1, the focus is only on space violations, and if α=0, then pressure is proportional to width violations.

The second mass production term will be directly linked to the pressure:

$$\dot{\rho}(t,x)=-b(x) \cdot p(t,x). \quad (13)$$

It describes loss of mass to relieve pressure and, thus, violations. Because pressure is proportional to violations, the pressure for space violations will drive mask polygons to shrink, and the pressure from width violations will drive mask polygons to expand.

Pressure p, as defined in (11), is measured in units of length.

5. Equation of State

The dependence between u, v and ρ can be viewed as an equation of state of the system, and is given by a functional operator W:

$$u(t,x)=W_u[\rho](t,x)$$

$$v(t,x)=W_v[\rho](t,x)$$

$$W=(W_u, W_v). \quad (14)$$

Figure 10:
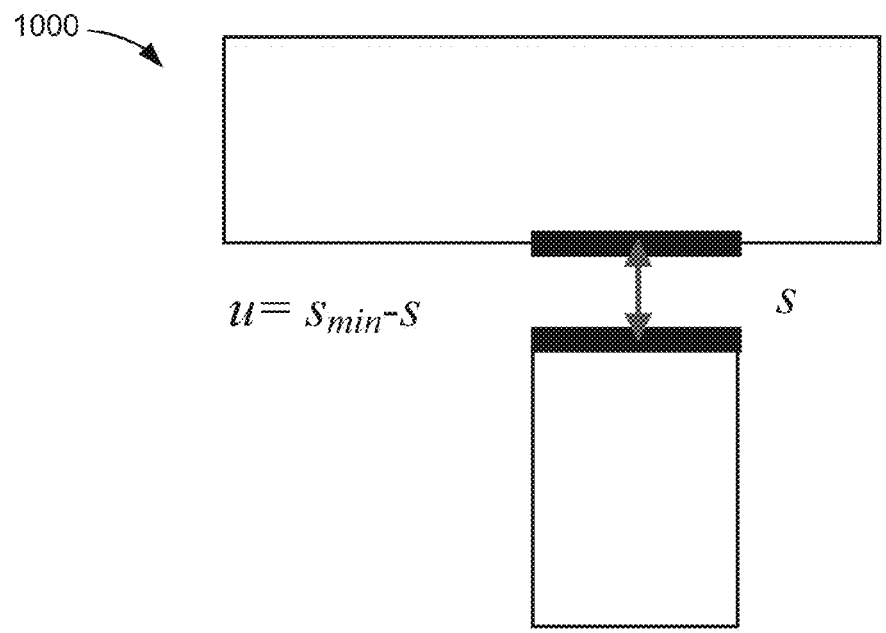
FIG. 10 shows an example of polygon spacing.

A first observation about this operator is that W is a sparse operator, because only small portions of mask contour interact to form an MRC violation. Second, after discretization of the mask contour to edges, an MRC violation is (generally) formed by two interacting edges that oppose each other. Diagram 1000 in FIG. 10, for instance, shows two interacting edges where $s_{min}$ is minimum spacing. The interacting edges are thick bars s distance apart. W is linear for this case.

In this case the discrete version of W is not only sparse, but affine (with matrix A and shifting vector $W_0$), and its matrix A has only 2 non-zero entries:

$$W_u u = Au + w_0 \quad (15)$$

$$A = \Delta y \begin{pmatrix} 0 & 0 & 0 & 0 & \ldots & 0 & 0 & 0 & 0 & 0 \\ & & & & \ldots & & & & & \\ 0 & \ldots & 0 & 1 & 0 & \ldots & 0 & 1 & 0 & \ldots \\ 0 & 0 & 0 & 0 & \ldots & 0 & 0 & 0 & 0 & 0 \\ & & & & \ldots & & & & & \\ & & & & \ldots & & & & & \\ & & & & \ldots & & & & & \\ & & & & \ldots & & & & & \\ & & & & \ldots & & & & & \\ 0 & 0 & 0 & 0 & \ldots & 0 & 0 & 0 & 0 & 0 \end{pmatrix}.$$

Thus, the second notable observation is that W may be an affine functional:

$$u(t, x) = \Delta y \int_C L_u(\xi, x)\rho(t, x)dx + w_0(x), \quad (16)$$

where $L_u$ is the kernel of $W_u$. However, this holds only for the "opposite" violation types. For the diagonal, non-Manhattan violations, the distance s involves quadratic and square root non-linearities, so W is no longer linear.

A third observation is that W (if linear) is non-negatively defined, so it is expected that any positive space violation will produce positive pressure to shrink polygons.

6. Model

Governing equations can be collected to form the following closed model of a Cauchy problem:

$$\begin{cases} \frac{\partial \rho}{\partial t} = \frac{\partial}{\partial x}\left(a\frac{\partial}{\partial x}p\right) - bp \\ p = \alpha u - (1-\alpha)v \\ u = W_u[\rho] \\ v = W_v[\rho] \end{cases} \quad (17)$$

$$\rho(t=0, x) = \rho^0(x)$$

7. Mass Production

In the absence of diffusion, for space ($\alpha=1$) and "opposite" type of violations, one gets model with mass production only:

$$\begin{cases} \frac{\partial \rho}{\partial t} = -bu \\ u = W_u[\rho] \end{cases}. \quad (18)$$

Figure 11:
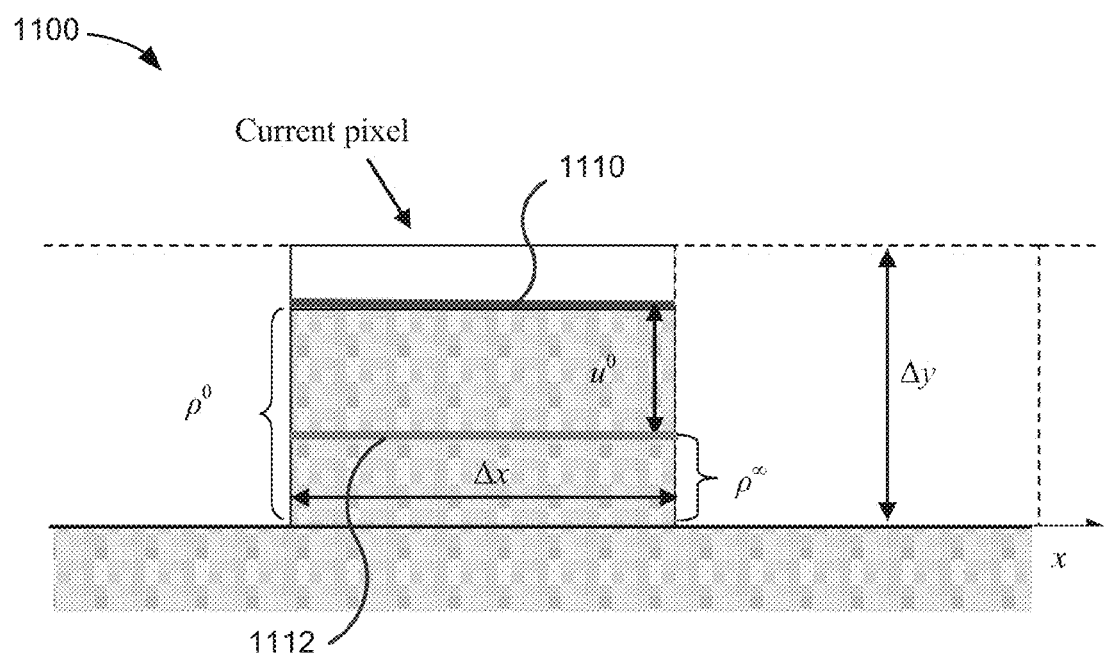
FIG. 11 shows an original and final fill of a pixel according to an aspect of the disclosed technology.

Diagram 1100 in FIG. 11 shows an original space violation $u^0$. The pixel's $\Delta x \Delta y$ density is driven from $\rho^0$ to $\rho^\infty$ in the process of fixing this violation. Red line 1110 shows original volume of the pixel, and green line 1112 is the final fill of the pixel.

In the vicinity of the violation, the operator W acts as $$u = u^0 (\rho - \rho^0)\Delta y, \quad (19)$$

and the solution of (18) is $$\rho = \rho_\infty + (\rho^0 - \rho^\infty)e^{-b\Delta y \cdot t} \quad (20)$$
$$u = u^0 e^{-b\Delta y \cdot t}$$
$$\rho^\infty = \rho^0 - \frac{u^0}{\Delta y}$$

Figure 12:
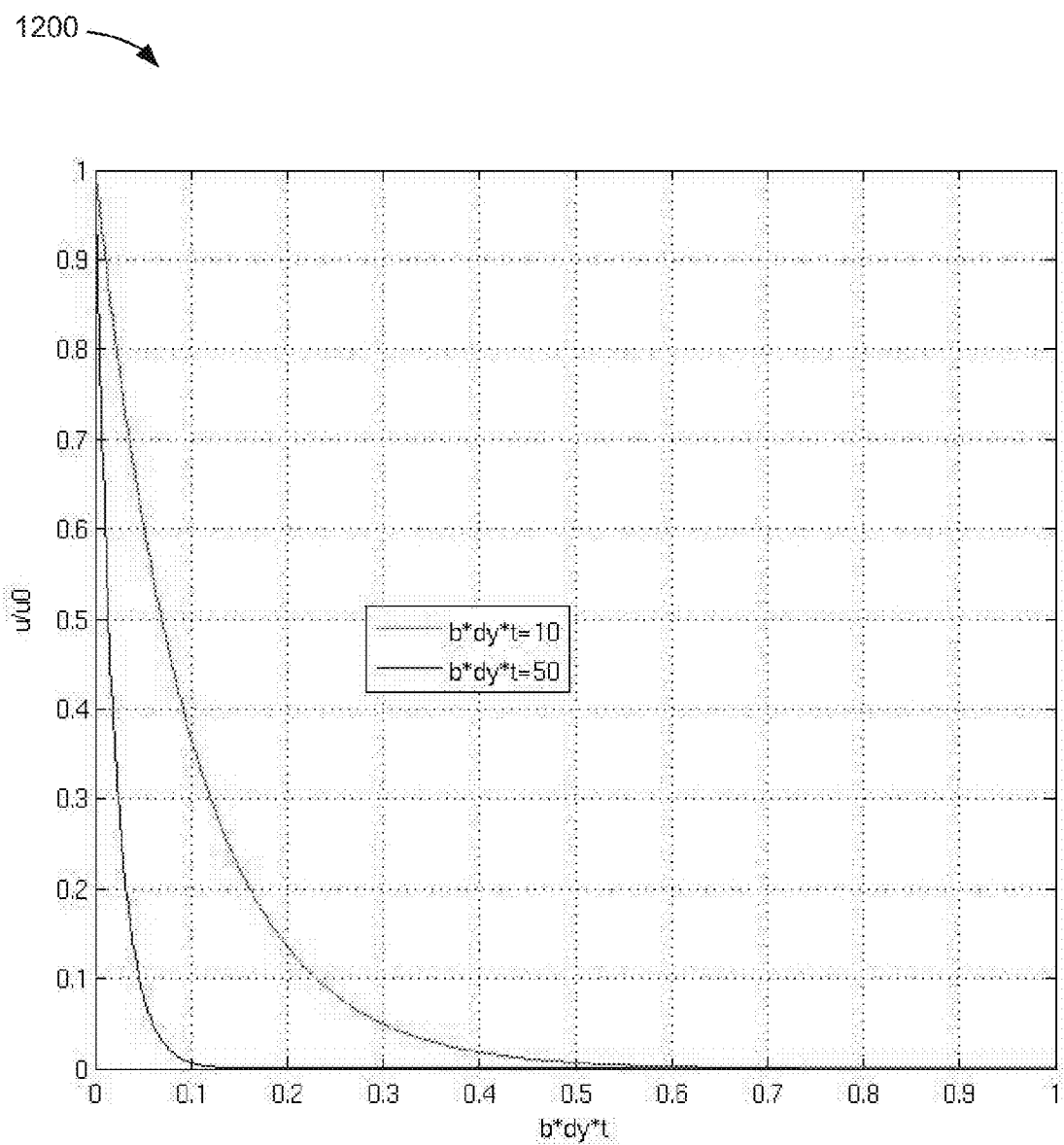
FIG. 12 shows exponential reduction in a space violation.
Figure 13:
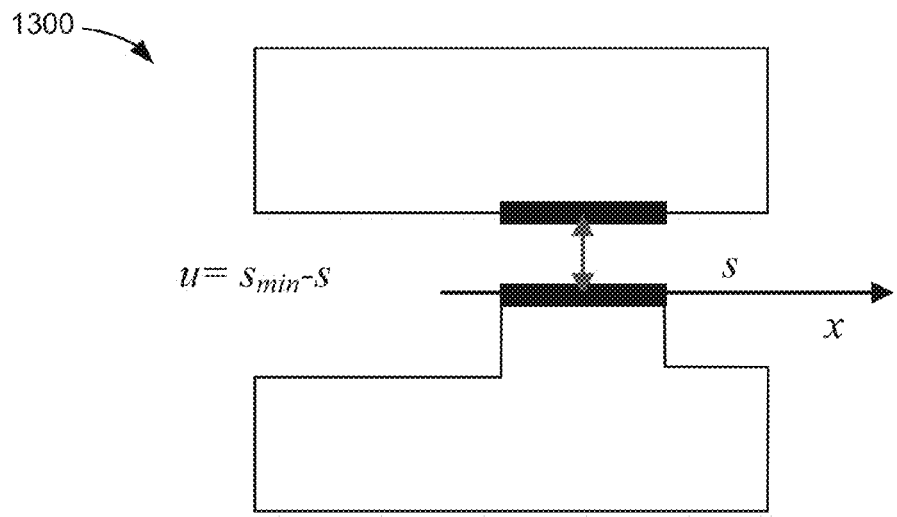
FIG. 13 show the space violation for FIG. 12.

This means that the original space violation $u^0$ reduces exponentially in time, but always stays positive: the "no violation" value 0 is asymptotically approached as shown in graph 1200 of FIG. 12, which shows the exponential reduction in space violation for the example configuration in diagram 1300 of FIG. 13.

In a similar situation for width violation ($\alpha=0$), one gets:

$$\begin{cases} \frac{\partial \rho}{\partial t} = bv \\ v = W_v[\rho]. \end{cases} \quad (21)$$

Figure 14:
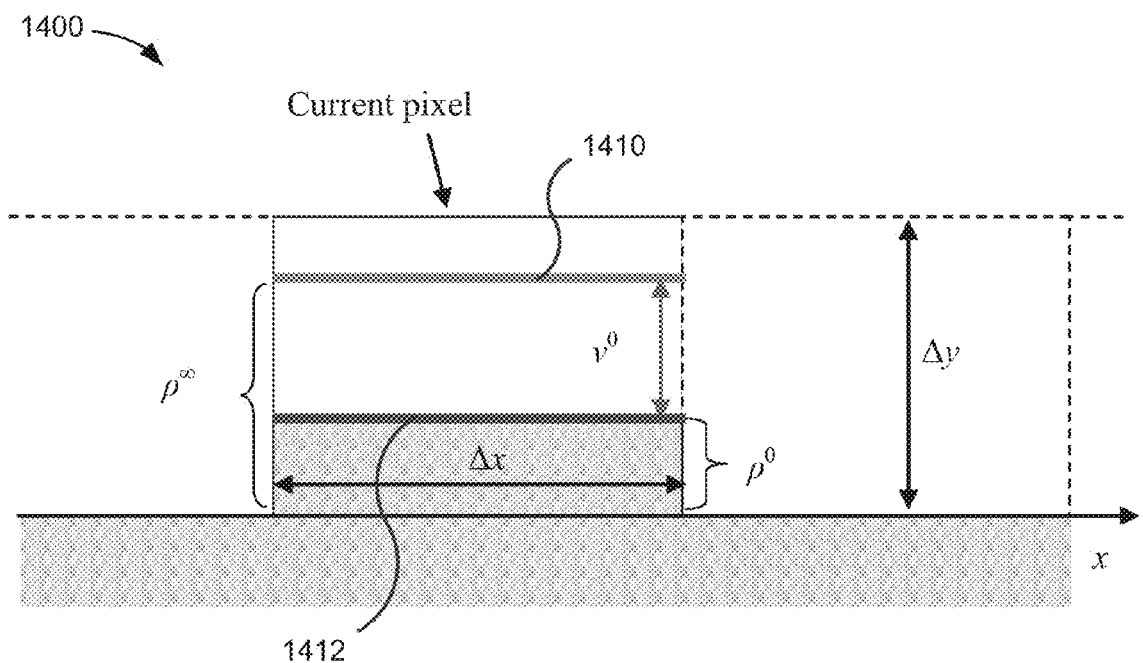
FIG. 14 shows an original and final fill of a pixel according to another aspect of the disclosed technology.

Diagram 1400 in FIG. 14 shows an original width violation $v^0$. The pixel's $\Delta x \Delta y$ density is driven from $\rho^0$ to $\rho^\infty$ in the process of fixing this violation. Red line 1412 shows original volume of the pixel, and green line 1410 is final fill of the pixel.

In the vicinity of the violation, the operator $W_v$ acts as $$v = v^0 - (\rho - \rho^0)\Delta y. \quad (22)$$

Substituting this into (21) gives:

$$\rho = \rho^0 + (\rho^\infty - \rho^0)(1 - e^{-b\Delta y \cdot t}) \quad (23)$$
$$v = v^0 e^{-b\Delta y \cdot t}$$
$$\rho^\infty = \rho^0 + \frac{v^0}{\Delta y}$$

A conflicting situation is now considered. In this conflicting situation, there is no such $\rho$ that cleans up both width and space violations.

Figure 15:
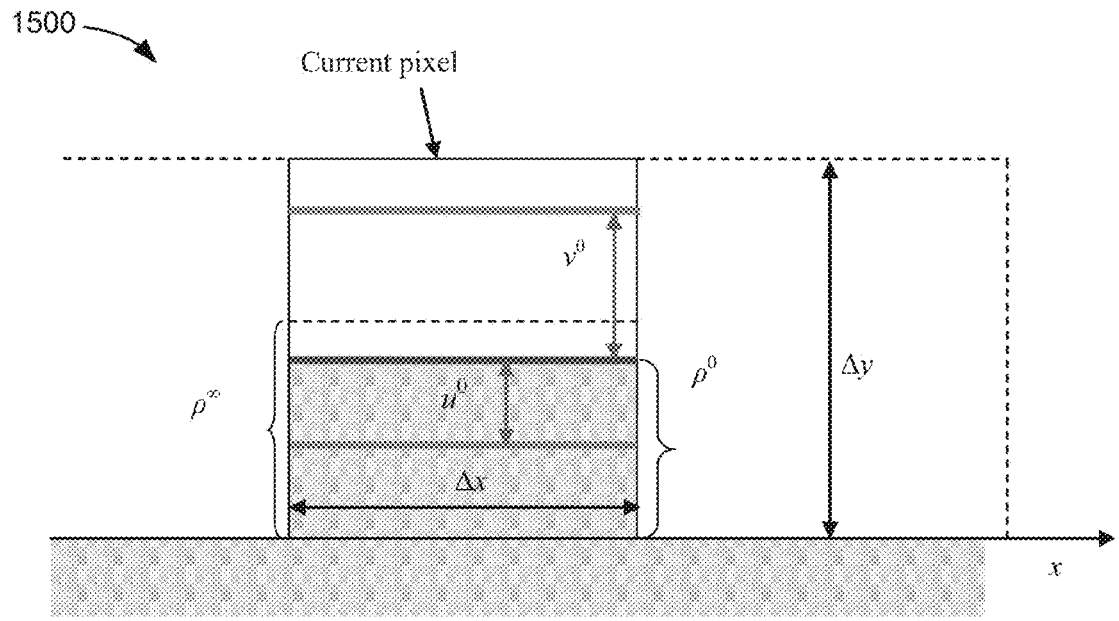
FIG. 15 illustrates a space and width violation.

Diagram 1500 of FIG. 15 illustrates this situation. In FIG. 15, conflict of space $u^0$ and width $v^0$ violations are shown. The final density $\rho^\infty$ of the pixel does not resolve either space or width violation.

If in one pixel, one gets both violations, then the following system can be obtained from (17, $\alpha=0.5$):

$$\frac{\partial \rho}{\partial t} = -bp \quad (24)$$
$$p = 0.5u - 0.5v$$
$$u = u^0 + (\rho - \rho^0)\Delta y$$
$$v = v^0 - (\rho - \rho^0)\Delta y.$$

The solution of this is:

$$\rho = \rho^0 + \frac{v^0 - u^0}{2\Delta y}(1 - e^{-b\Delta y \cdot t}) \quad (25)$$
$$u = \frac{u^0 + v^0}{2} + \frac{u^0 - v^0}{2}e^{-b\Delta y \cdot t}$$
$$v = \frac{u^0 + v^0}{2} - \frac{u^0 - v^0}{2}e^{-b\Delta y \cdot t}.$$

The final density $\rho^\infty$ is such that:
1. if $u^0 > v^0$, then the final violation $u^\infty < u^0$, i.e. space violation gets better, but $v_\infty > v_0$ gets worse.
2. if $u^0 < v^0$, then the final violation $v^\infty < v^0$, i.e. the width violation gets better, but $u^\infty > u^0$ gets worse.

The conclusion is that in the presence of conflicts, the model reduces the largest violation, but increases the smallest violation. The model balances violations in such way that the final density $\rho^\infty$ of the pixel ends up in the position in the middle of violations. This situation is typical for normalization in norm 2.

In this subsection, one isolated pixel was considered and it was shown that the model cannot clean both violations locally. Once pixel has two violations, these violations cannot be cleaned-up by changing the density of this pixel. Moreover, once the pixel has two violations (becomes a conflicting pixel), this number cannot be reduced by local means. In certain implementations, one has to wait until other pixels, that have only one violation, will reduce the number of violations to 1 in the conflicting pixel. Only then the conflicting pixel can "take care" of itself.

8. Diffusion

The model with constant diffusion coefficient, and space violations, is:

$$\frac{\partial \rho}{\partial t} = a \frac{\partial^2}{\partial x^2} p \qquad (26)$$

$$p = u$$

$$u = \begin{cases} 0, & \text{pixel 1} \\ (\rho - \rho_2^\infty)\Delta y, & \rho > \rho_2^\infty, \text{ pixel 2} \\ 0, & \rho \le \rho_2^\infty, \text{ pixel 2} \\ 0, & \text{pixel 3} \end{cases}$$

Here $\rho_2^\infty$ is density of the second pixel that fixes the violation (corresponds to $u_2=0$).

Figure 16:
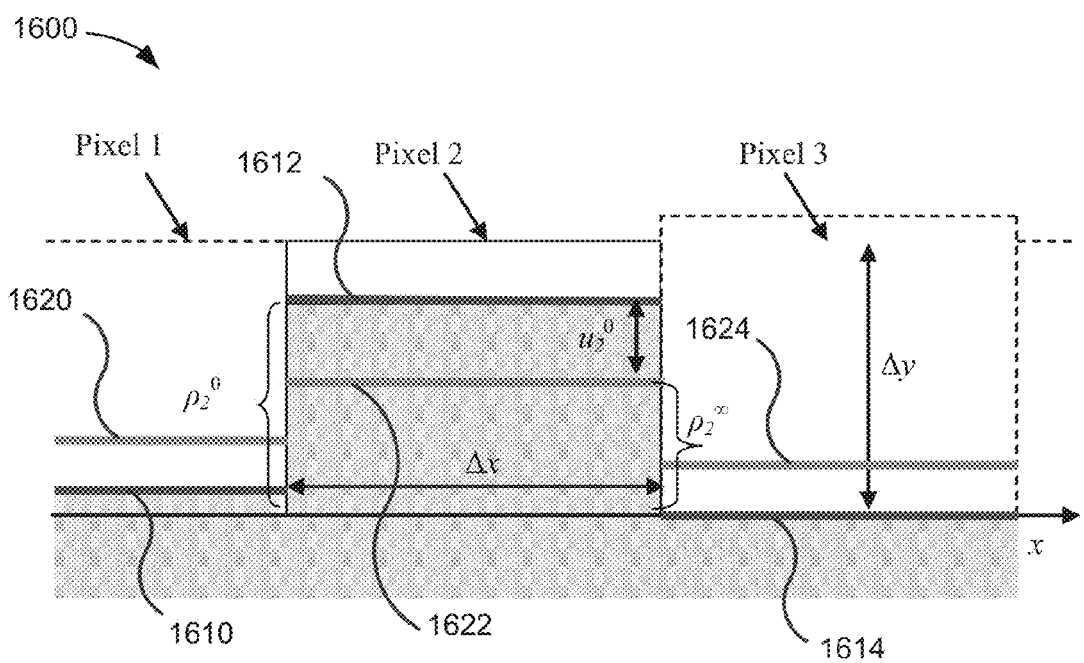
FIG. 16 shows original and final fills of three pixels according to another aspect of the disclosed technology.

Diagram 1600 of FIG. 16 shows three neighboring pixels. Pixels 1 and 3 have no space violations, and not pressured. The red lines 1610, 1612, 1614 are the original levels. The green lines 1620, 1622, 1624 show the final fill of the pixels.

The discretization of spatial coordinate gives:

$$\frac{d\rho_1}{dt} = a \frac{\Delta y}{(\Delta x)^2} \cdot (\rho_2 - \rho_2^\infty) \qquad (27)$$

$$\frac{d\rho_2}{dt} = -2a \frac{\Delta y}{(\Delta x)^2} \cdot (\rho_2 - \rho_2^\infty)$$

$$\frac{d\rho_3}{dt} = a \frac{\Delta y}{(\Delta x)^2} \cdot (\rho_2 - \rho_2^\infty).$$

Here, it is assumed that the pixels 1 and 3 are isolated (no mass transfer from outside boundaries, left boundary for pixel 1 and right boundary for pixel 3 are isolated), thus the mass is conserved in three pixels under consideration. $\rho_1(t)$, $\rho_2(t)$, $\rho_3(t)$ are densities of pixels 1, 2, and 3.

Figure 17:
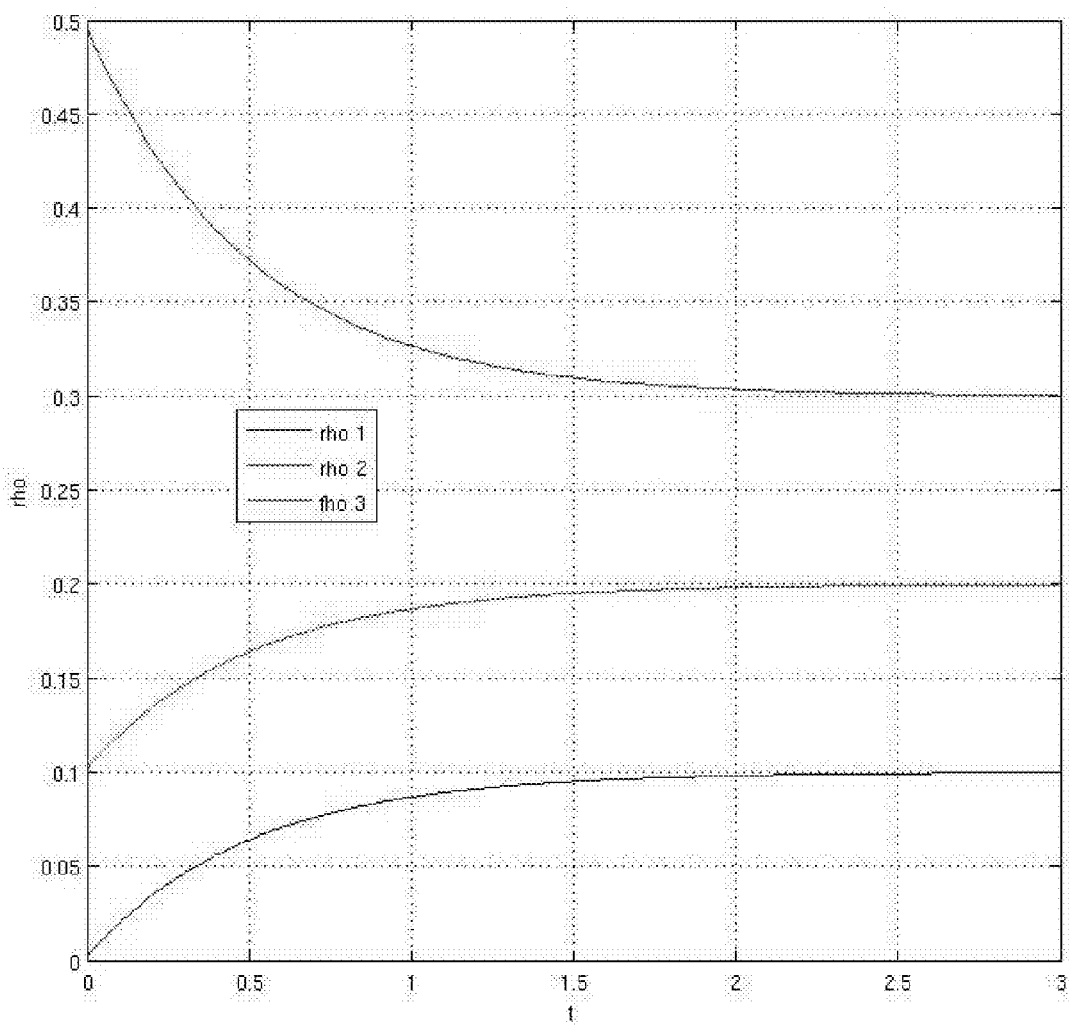
FIG. 17 shows change in time of pixel densities under certain conditions.

The solution for this system is:

$$\rho_1 = \rho_1^0 + 0.5 \cdot (\rho_2^0 - \rho_2^\infty)\left(1 - e^{-2a\frac{\Delta y}{(\Delta x)^2}t}\right) \qquad (28)$$

$$\rho_2 = \rho_2^0 - (\rho_2^0 - \rho_2^\infty)\left(1 - e^{-2a\frac{\Delta y}{(\Delta x)^2}t}\right)$$

$$\rho_3 = \rho_3^0 + 0.5 \cdot (\rho_2^0 - \rho_2^\infty)\left(1 - e^{-2a\frac{\Delta y}{(\Delta x)^2}t}\right),$$

where $\rho_1^0$, $\rho_2^0$, $\rho_3^0$, are initial densities of pixels 1, 2, and 3, and shown in graph 1700 of FIG. 17. In particular, graph 17 shows the change in time of pixel densities under the following conditions: $\rho_1^0=0$, $\rho_2^0=0.5$, $\rho_3^0=0.1$, $\rho_2^\infty=0.3$, $a=0.5$, $\Delta x=\Delta y=1$.

One can see from graph 1700 that diffusion fixes a violation locally (changing density of one pixel) exponentially asymptotically in time. The excess mass is redistributed into the neighboring pixels.

9. Numerical discretization

Here, a numerical iterative schema is developed to solve the following PDE system:

$$\rho(t=0, x) = \rho^0(x) \qquad (29)$$

$$\frac{\partial \rho}{\partial t} = -\frac{\partial j}{\partial x} - bp$$

$$j = -a \frac{\partial p}{\partial x}$$

$$p = \alpha u - (1-\alpha)v$$

$$u = (u, v) = W[\rho].$$

Figure 18:
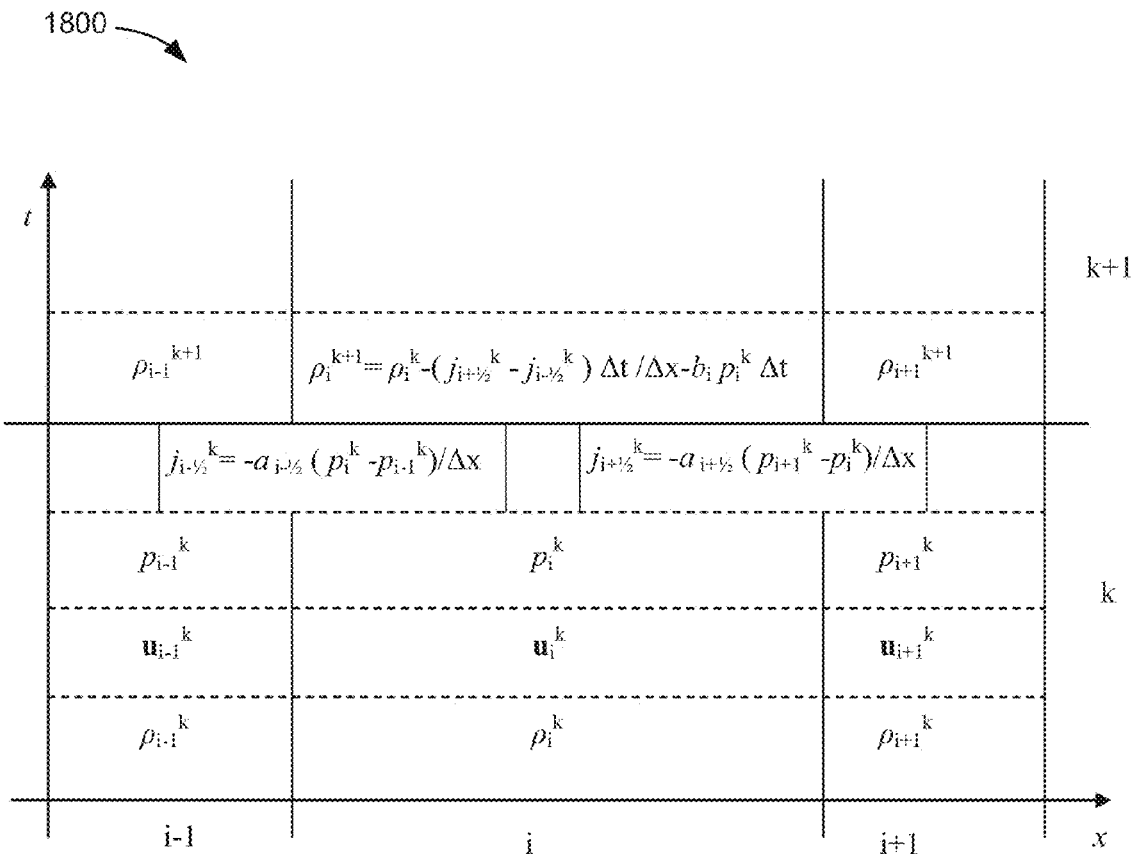
FIG. 18 shows an explicit finite difference schema.

The explicit Euler schema 1800 shown in FIG. 18 can be used to solve (29).

10. User Options

The finite schema in FIG. 18 has parameters that are not convenient for the user to define, like a, etc. Here new, user-friendly, parameters are defined for the problem.

Consider $\Delta w_b$, the reduction of the violation in one iteration due to mass production term:

$$\Delta w_b = (\rho_i^0 - \rho_i^1)\Delta y = b_i p_i^0 \Delta t \Delta y. \qquad (30)$$

The violation for pixel i is $p_i^0$. Characteristic value of this quantity is $$w_{max} = \max(u_{min}, v_{min}). \qquad (31)$$

From (30), one gets:

$$\Delta w_b = \langle b \rangle w_{max} \Delta y \Delta t \qquad (32)$$

$$\Delta t = \frac{\Delta w_b}{w_{max}\langle b \rangle \Delta y},$$

where $\langle b \rangle$ is average value of b(x). If normalized mass production coefficient is introduced (it is 1 if b is constant)

$$\bar{b}(x) = \frac{b(x)}{\langle b \rangle} \qquad (33)$$

$$\bar{b}(x) \sim 1,$$

then $\Delta t$ can be eliminated from the second term in finite differences:

$$\rho_i^{k+1} = \rho_i^k - (j_{i+1/2}^k - j_{i-1/2}^k)\frac{\Delta t}{\Delta x} - \bar{b}_i \frac{\Delta w_b}{w_{max}\Delta y} p_i^k \qquad (34)$$

Now consider $\Delta w_a$, the reduction of the violation in one iteration due to diffusion term:

$$\Delta w_a = (\rho_i^0 - \rho_i^1)\Delta y \approx \langle a \rangle \left(\frac{\partial^2 p}{\partial x^2}\right)\Delta y \Delta t = 8\langle a \rangle \frac{w_{max}}{l_x^2} \Delta y \Delta t. \qquad (35)$$

Here $l_x^2$ is size of the violation in x directions, so that the pressure changes from 0 (x=0) to $w_{max}$ (x=$l_x/2$) and back to 0 (x=$l_x$). From here, one can find $\Delta t$:

$$\Delta t = \frac{l_x^2 \Delta w_a}{8\langle a \rangle w_{max} \Delta y}. \quad (36)$$

With this, $\Delta t$ can be eliminated from the first term of finite differences:

$$\rho_i^{k+1} = \rho_i^k - \left(\overline{j}_{i+1/2}^k - \overline{j}_{i-1/2}^k\right)\frac{\Delta w_a}{w_{max}} \frac{l_x^2}{8\Delta x \Delta y} - \overline{b}_i \frac{\Delta w_b}{w_{max}} \frac{p_i^k}{\Delta y} \quad (37)$$

$$\overline{j}_{i-1/2}^k = -\overline{a}_{i-1/2} \frac{(p_i^k - p_{i-1}^k)}{\Delta x}$$

$$\overline{a}(x) = \frac{a(x)}{\langle a \rangle} \sim 1$$

In a simpler notation:

$$\rho_i^{k+1} = \rho_i^k - \left(\overline{j}_{i+1/2}^k - \overline{j}_{i-1/2}^k\right) d_a - \overline{b}_i d_b \frac{p_i^k}{\Delta y} \quad (38)$$

$$\overline{j}_{i-1/2}^k = -\overline{a}_{i-1/2} \frac{(p_i^k - p_{i-1}^k)}{\Delta x}$$

$$d_a = \frac{\Delta w_a}{w_{max}} \frac{l_x^2}{8\Delta x \Delta y}$$

$$d_b = \frac{\Delta w_b}{w_{max}}.$$

Figure 19:
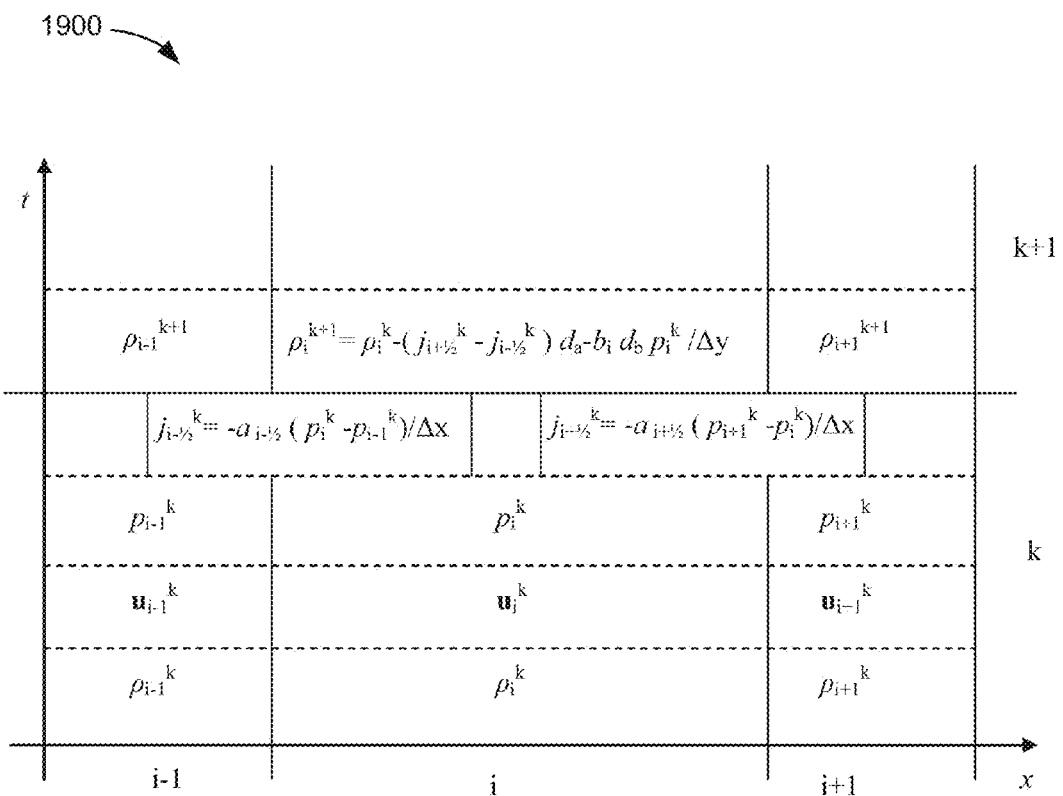
FIG. 19 shows the schema in FIG. 18 in a simpler notation.

Schema 1900 in FIG. 19 is the same as in FIG. 18, but in a simpler final notation. Here over-bar is assumed in a, b and j, like in (38).

The parameters for this example embodiment are described in the following table:

TABLE 1

| Symbol | Meaning | Example Default/ Initial value | Units |
|---|---|---|---|
| | User defined options | | |
| K | overall number of finite difference iterations | 10 | 1 |
| $\Delta x$ | pixel size in x direction | 0.015 | um |
| $h_y$ | aspect ratio of the pixel, height over width | 1 | 1 |
| $u_{min}$ | minimum space | 0.015 | um |
| $v_{min}$ | minimum width | 0.015 | um |
| $l_x$ | width of the violation expected to be cleaned up by diffusion | 0.05 | um |
| $\Delta w_a$ | expected reduction of violation of width $l_x$ by diffusion in one iteration | 0.00025 | um |
| $\Delta w_b$ | expected reduction of violation by mass production in one iteration | 0.00025 | um |
| | Internally defined or calculated vectors and parameters | | |
| $\Delta y = h_y \Delta x$ | pixel size in y direction | None | um |
| $\overline{a}_i = 1$ | diffusion coefficient vector, constant for now | 1 | 1 |
| $\overline{b}_i = 1$ | mass production coefficient vector, constant for now | 1 | 1 |
| $w_{max}$ | scale of maximum violation | $\max(u_{min}, v_{min})$ | um |
| $d_a$ | diffusion scaling in finite differences | none | 1 |
| $d_b$ | mass production scaling in finite differences | none | 1 |
| | Variables | | |
| $\rho_i$ | pixel density | none | 1 |
| $p_i$ | pressure | 0 | um |
| $\overline{j}_{i-1/2}, \overline{j}_{i+1/2}$ | mass flux on the left and on the right boundary of the pixel | 0 | 1 |
| $u_i = (u_i, v_i)$ | space and width violations | 0 | um |

IV. Conclusion

Although certain embodiments have been described above in terms of the illustrative embodiments, the person of ordinary skill in the art will recognize that other embodiments, examples, substitutions, modification and alterations are possible. In particular, the disclosed methods, apparatuses, and systems should not be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved. Furthermore, any features or aspects of the disclosed embodiments can be used in various combinations and subcombinations with one another. For example, one or more method acts from one embodiment can be used with one or more method acts from another embodiment and vice versa.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Having illustrated and described the principles of the illustrated embodiments, the embodiments can be modified in various arrangements while remaining faithful to the concepts described above. In view of the many possible embodiments to which the principles of the illustrated embodiments may be applied, it should be recognized that the illustrated embodiments are only examples and should not be taken as limiting the scope of the disclosure. I claim all that comes within the scope of the appended claims and their equivalents.

What is claimed is:

1. One or more computer-readable media storing computer-executable instructions when executed by a computer cause the computer to perform a method, the method comprising:
    deriving a local density value for one or more geometric elements in at least a portion of a layout design for an integrated circuit; and
    modifying the shape of one or more of the geometric elements while maintaining the local density value across the one or more geometric elements in the at least a portion of the layout design.

2. The one or more computer-readable media of claim 1, wherein the modifying the shape of one or more of the geometric elements while maintaining the local density value across the geometric elements comprises modifying the shape of one or of the geometric element such that a new local density value after the modification is within a threshold value of the derived local density value.

3. The one or more computer-readable media of claim 1, wherein the method further comprises partitioning the layout design into a plurality of partitions and the at least a portion of the layout design comprises one of the partitions.

4. The one or more computer-readable media of claim 3, wherein the threshold value indicates a 2% change or less.

5. The one or more computer-readable media of claim 1, wherein the modifying comprises re-positioning one or more of the geometric shapes.

6. The one or more computer-readable media of claim 1, wherein the modifying comprises adjusting an edge of one or more of the geometric shapes.

7. The one or more computer-readable media of claim 1, wherein the modifying comprises adjusting a boundary of one or more of the geometric shapes by adjusting one or more edge fragments.

8. A computer-implemented method, comprising:
    by computing hardware,
        deriving a local density value for one or more geometric elements in at least a portion of a layout design for an integrated circuit; and
        modifying the shape of one or more of the geometric elements while maintaining the local density value across the one or more geometric elements in the at least a portion of the layout design.

9. The method of claim 8, wherein the modifying the shape of one or more of the geometric elements while maintaining the local density value across the geometric elements comprises modifying the shape of one or of the geometric element such that a new local density value after the modification is within a threshold value of the derived local density value.

10. The method of claim 8, wherein the method further comprises partitioning the layout design into a plurality of partitions and the at least a portion of the layout design comprises one of the partitions.

11. The method of claim 10, wherein the threshold value indicates a 2% change or less.

12. The method of claim 8, wherein the modifying comprises re-positioning one or more of the geometric shapes.

13. The method of claim 8, wherein the modifying comprises adjusting an edge of one or more of the geometric shapes.

14. The method of claim 8, wherein the modifying comprises adjusting a boundary of one or more of the geometric shapes by adjusting one or more edge fragments.

15. A system, comprising:
    means for deriving a local density value for one or more geometric elements in at least a portion of a layout design for an integrated circuit; and
    means for modifying the shape of one or more of the geometric elements while maintaining the local density value across the one or more geometric elements in the at least a portion of the layout design.

* * * * *